United States Patent [19]

Kessler

[11] Patent Number: 4,816,776
[45] Date of Patent: Mar. 28, 1989

[54] INTEGRATED CIRCUIT CONFIGURATION AND METHOD FOR MONITORING A CO-INTEGRATED OSCILLATOR

[75] Inventor: Heinrich Kessler, Munich, Fed. Rep. of Germany

[73] Assignee: Siemens Aktiengesellschaft, Munich, Fed. Rep. of Germany

[21] Appl. No.: 181,186

[22] Filed: Apr. 13, 1988

[30] Foreign Application Priority Data

Apr. 13, 1987 [DE] Fed. Rep. of Germany ....... 3712517

[51] Int. Cl.$^4$ ............................................. H03B 1/00
[52] U.S. Cl. ...................................... 331/49; 331/44; 331/64; 371/8; 371/61
[58] Field of Search ........................ 331/44, 46, 49, 56, 331/64, 108 L; 324/79 R, 79 D, 78 E; 371/8, 61

[56] References Cited

U.S. PATENT DOCUMENTS

| | | | |
|---|---|---|---|
| 3,289,097 | 11/1966 | Martin | 331/49 |
| 3,708,686 | 1/1973 | Butler, Jr. et al. | 307/149 |
| 4,667,328 | 5/1987 | Imran | 324/78 E X |

FOREIGN PATENT DOCUMENTS

| | | |
|---|---|---|
| 0006328 | 1/1980 | European Pat. Off. |
| 2532587 | 1/1977 | Fed. Rep. of Germany |
| 2315736 | 1/1977 | France |

OTHER PUBLICATIONS

Bell System Technical Journal, vol. 62, No. 10, Teil 3, Dec. 1983, pp. 3377-3390.
J. M. Kiker, Jr. et al.: "The ARGA Single-Sideband Microwave Radio System: Frequency Control", Pa. 3378, line 24-Pa. 3380, line 10; Pa. 3384, line 17-Pa. 3388, line 38; FIGS. 2,4,6.

Primary Examiner—Eugene R. LaRoche
Assistant Examiner—David Mis
Attorney, Agent, or Firm—Herbert L. Lerner; Laurence A. Greenberg

[57] ABSTRACT

An integrated circuit configuration and a method monitor an integrated oscillator in the circuit. The oscillator has a minimum frequency and furnishes a synchronously controlling clock rate for the functioning of the integrated circuit when excited by an external frequency standard. An integrated reserve oscillator has a maximum frequency below the minimum frequency of the oscillator. An integrated frequency comparator is connected to the reserve oscillator and to the oscillator for comparing the frequency of the reserve oscillator with the frequency of the oscillator.

9 Claims, 1 Drawing Sheet

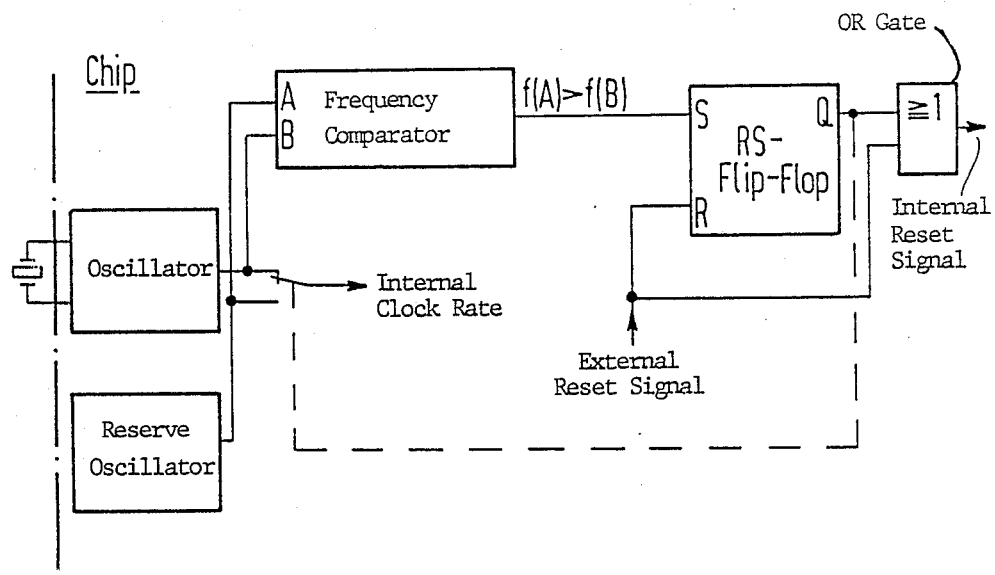

INTEGRATED CIRCUIT CONFIGURATION AND METHOD FOR MONITORING A CO-INTEGRATED OSCILLATOR

The invention relates to an integrated circuit configuration and method for monitoring an integrated oscillator, which is excited through an external frequency standard and furnishes a synchronously controlling clock rate for the functioning of the integrated circuit.

Integrated circuits such as microcontrollers that are controlled by a synchronous clock rate, generate clock signals in the usual manner by means of an oscillator co-integrated into the circuit. The frequency is fixed by an external frequency standard such as an oscillator quartz.

Breakage of the oscillator quartz or an interruption in the line leading from the frequency standard to the integrated circuit sends the oscillator out of control and places the integrated circuit into an undefined state. If the integrated circuit fails, then systems and processes controlled by it, such as engine controls in motor vehicles or automated industrial production processes, can also get out of control.

It is known to monitor such uncontrolled systems or process breakdowns, which are ascribed to a functional failure of the integrated circuit and possibly to overcome these problems, by means of an external circuit to be constructed by the user. However, the disadvantage of this manner of dealing with the problem is that on one hand, the user must have detailed knowledge about the structure of the integrated circuit and on the other hand, practical construction of the external monitoring circuit entails additional system costs.

It is accordingly an object of the invention to provide an integrated circuit configuration and method for monitoring a co-integrated oscillator, which overcomes the hereinaforementioned disadvantages of the heretofore-known methods and devices of this general type and which monitors the frequency of the co-integrated oscillator directly, so that if it fails the integrated circuit is placed int a defined state.

With the foregoing and other objects in view there is provided, in accordance with the invention, an integrated circuit configuration, comprising an integrated oscillator to be monitored, the oscillator having a minimum frequency and furnishing a synchronously controlling clock rate for the functioning of the integrated circuit when excited by an external frequency standard, an integrated reserve oscillator having a maximum frequency below the minimum frequency of the oscillator, and an integrated frequency comparator connected to the reserve oscillator and to the oscillator for comparing the frequency of the reserve oscillator with the frequency of the oscillator.

In accordance with another feature of the invention, the reserve oscillator consists of integrated circuit elements.

In accordance with a further feature of the invention, the reserve oscillator includes a Schmitt trigger circuit.

In accordance with an added feature of the invention, there is provided a logical circuit coupled to the frequency comparator for memory storage of at least one memory bit.

With the objects of the invention in view, there is also provided a method for monitoring an integrated oscillator furnishing a synchronously controlling clock rate for the functioning of an integrated circuit when excited by an external frequency standard, which comprises comparing the frequency of an integrated reserve oscillator having a maximum frequency below the minimum frequency of the oscillator to the frequency of the oscillator with an integrated frequency comparator, and deriving the clock rate synchronously controlling the function of the integrated circuit from the reserve oscillator if the frequency of the oscillator drops below the frequency of the reserve oscillator.

Since the frequency of the reserve oscillator need merely be located below the minimum frequency of the oscillator and needs no stabilization in this configuration, the need for a corresponding external frequency standard for it can be dispensed with. The practical construction of the circuit can therefore be accomplished by exclusively using integrated circuit components, such as a Schmitt trigger circuit, which can be connected to the voltage supply of the integrated circuit and therefore also need no external voltage source of their own.

In the event that the frequency standard that excites the co-integrated oscillator malfunctions, the frequency of the oscillator drops below the frequency of the reserve oscillator. The frequency comparator records this drop below the threshold and then derives the synchronously controlling clock rate for continued functioning of the integrated circuit from the reserve oscillator, thereby precluding an uncontrolled breakdown of the system or process controlled through the integrated circuit.

In accordance with another mode of the invention, there is provided a method which comprises setting a memory bit inside a logic element which stores a defective frequency comparison that has occurred in memory and can only be erased again by means of an external reset signal, upon response of the frequency comparator and switchover from the oscillator to the reserve oscillator.

Since the reserve oscillator as a rule responds faster than the oscillator coupled to the external frequency standard when the supply voltage is switched on, it is possible to place the circuit configuration into a new defined output state after the supply voltage is switched on, through the use of the external reset signal.

In accordance with a further mode of the invention, there is provided a method which comprises establishing a defined or fixed state of the circuit with the memory bit.

In accordance with a concomitant mode of the invention, there is provided a method which comprises establishing or initiating an emergency operation of the integrated circuit with the memory bit.

Other features which are considered as characteristic for the invention are set forth in the appended claims.

Although the invention is illustrated and described herein as embodied in an integrated circuit configuration and method for monitoring a co-integrated oscillator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

The figure of the drawing is a schematic and block circuit diagram an embodiment of the invention.

Referring now to the single figure of the drawing in detail and first, particularly, to FIG. 1 thereof, there is seen a frequency comparator co-integrated on a chip having two inputs A and B. The frequencies of an oscillator that is coupled to an external oscillator quartz and a co-integrated reserve oscillator are applied to the inputs A and B. An RS flip-flop has an S input connected to the output side of the frequency comparator. In the event that the frequency f(A) of the reserve oscillator is greater than the frequency f(B) of the oscillator, a signal is present at the output of the frequency comparator that sets a memory bit in the RS flip-flop which switches an internal clock rate over from the oscillator to the reserve oscillator and simultaneously trips an internal reset signal provided by an OR gate, through the Q output of the RS flip-flop. An externally generated reset signal, which is applied to both the R input of the RS flip-flop and to another input of the OR gate, cancels the memory bit tripped by the frequency comparator in the RS flip-flop and generates an internal reset signal in the OR gate.

The foregoing is a description corresponding in substance to German Application P No. 37 12 517.6, dated April 13, 1987, the International priority of which is being claimed for the instant application, and which is hereby made part of this application. Any material discrepancies between the foregoing specification and the aforementioned corresponding German application are to be resolved in favor of the latter.

I claim:

1. Integrated circuit configuration, comprising an integrated oscillator to be monitored, said oscillator having a minimum frequency and furnishing a synchronously controlling clock rate for the functioning of the integrated circuit when excited by an external frequency standard, an integrated reserve oscillator having a maximum frequency below said minimum frequency of said oscillator, and an integrated frequency comparator connected to said reserve oscillator and to said oscillator for comparing the frequency of said reserve oscillator with the frequency of said oscillator.

2. Circuit configuration according to claim 1, wherein said reserve oscillator consists of integrated circuit elements.

3. Circuit configuration according to claim 1, wherein said reserve oscillator includes a Schmitt trigger circuit.

4. Circuit configuration according to claim 2, wherein said reserve oscillator includes a Schmitt trigger circuit.

5. Circuit configuration according to claim 1, including a logical circuit coupled to said frequency comparator for memory storage of at least one memory bit.

6. Method for monitoring an integrated oscillator furnishing a synchronously controlling clock rate for the functioning of an integrated circuit when excited by an external frequency standard, which comprises comparing the frequency of an integrated reserve oscillator having a maximum frequency below the minimum frequency of the oscillator to the frequency of the oscillator with an integrated frequency comparator, and deriving the clock rate synchronously controlling the function of the integrated circuit from the reserve oscillator if the frequency of the oscillator drops below the frequency of the reserve oscillator.

7. Method according to claim 6, which comprises setting a memory bit which stores a defective frequency comparison that has occurred in memory and can only be erased again by means of an external reset signal, upon switchover from the oscillator to the reserve oscillator.

8. Method according to claim 7, which comprises establishing a defined state of the circuit with the memory bit.

9. Method according to claim 7, which comprises establishing an emergency operation of the integrated circuit with the memory bit.

* * * * *